(12) United States Patent
Batlogg et al.

(10) Patent No.: US 6,284,562 B1
(45) Date of Patent: Sep. 4, 2001

(54) THIN FILM TRANSISTORS

(75) Inventors: Bertram Joseph Batlogg, Murray Hill; Christian Kloc, South Orange; Jan Hendrik Schon, Summit, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/441,751

(22) Filed: Nov. 17, 1999

(51) Int. Cl.$^7$ .................................................. H01L 51/40
(52) U.S. Cl. .............................. 438/99; 438/99; 438/197; 438/199; 257/350
(58) Field of Search .................... 438/99, 197, 198–199, 438/200–201; 257/350

(56) References Cited

U.S. PATENT DOCUMENTS

| | | | |
|---|---|---|---|
| 4,608,097 | * 8/1986 | Weinberger et al. | 148/33.3 |
| 5,155,566 | * 10/1992 | Nakayama et al. | 357/30 |
| 5,315,129 | * 5/1994 | Forrest et al. | 257/21 |
| 5,596,208 | * 1/1997 | Dodabalapur et al. | 257/66 |
| 5,625,199 | * 4/1997 | Baumbach et al. | 257/40 |
| 5,714,394 | * 2/1998 | Kadosh et al. | 437/21 |
| 5,849,403 | * 12/1998 | Aoki et al. | 428/220 |
| 5,936,259 | * 8/1999 | Katz et al. | 257/40 |
| 5,946,551 | * 8/1999 | Dinitrakopoulos et al. | 438/99 |
| 5,981,970 | * 11/1999 | Dimitrakopoulos et al. | 257/40 |

FOREIGN PATENT DOCUMENTS

WO99/66540 * 6/1998 (NO) .

OTHER PUBLICATIONS

B. Crone et al. "Novel Fabrication Methods of Organic Complementary Circuits" IEEE 0–7803–5410–9/99 (IEDM 99–115) p. 5.3.1–5.3.4.*

A. Dodabalapur et al. "Organic Heterstructure FET's" 1995 Science vol. 269 p. 1560–62.*

* cited by examiner

Primary Examiner—Matthew Smith
Assistant Examiner—G. Lee
(74) Attorney, Agent, or Firm—Peter V. D. Wilde; Thomas, Kayden, Horstemeyer & Risley LLP

(57) ABSTRACT

The specification describes thin film transistor CMOS integrated circuits wherein the semiconductor is an ambipolar organic material. The preferred material is tetracene or pentacene. In these CMOS devices, a single homogeneous layer of tetracene or pentacene can be used in both n-type (inversion) and p-type (accumulation) devices.

10 Claims, 11 Drawing Sheets

US 6,284,562 B1

THIN FILM TRANSISTORS

FIELD OF THE INVENTION

The invention relates to thin film transistors (TFTs), and more particularly to TFT devices with new ambipolar semiconductor materials.

BACKGROUND OF THE INVENTION

Over the last decade, IC technologies have been proposed that use organic semiconductor thin film transistors (TFTs). The chief attractions of such circuits stem from the anticipated ease of processing and compatibility with flexible substrates. These advantages are expected to translate into a low-cost IC technology suitable for applications such as smart cards, electronic tags, displays, et al.

TFT devices are described in F. Garnier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., J. Applied Physics, Vol. 70(1), pp. 469–475; and G. Horowitz et al., Synthetic Metals, Vol. 42–43, pp. 1127–1130. The devices described in these references are based on polymers or oligomers as the active materials, in contrast with the amorphous silicon TFT structures that were developed earlier. The devices are typically field effect transistors (FETs). Polymer active devices have significant advantages over semiconductor TFTs in terms of simplicity of processing and resultant low cost. They are also compatible with polymer substrates used widely for interconnect substrates. Polymer TFTs are potentially flexible, and polymer TFT ICs can be mounted directly on flexible printed circuit boards. They also have compatible coefficients of thermal expansion so that solder bonds, conductive expoxy bonds, and other interconnections experience less strain than with semiconductor IC/polymer interconnect substrate combinations. While MIS FET devices are most likely to find widespread commercial applications, TFT devices that utilize both p-type and n-type organic active materials are also known. See e.g., U.S. Pat. No. 5,315,129. S. Miyauchi et al., Synthetic Metals, 41–43 (1991), pp. 1155–1158, disclose a junction FET that comprises a layer of p-type polythiophene on n-type silicon.

Recent advances in polymer based TFT devices are described in U.S. Pat. No. 5,596,208, issued May 10, 1996, U.S. Pat. No. 5,625,199, issued Apr. 29, 1997, and U.S. Pat. No. 5,574,291, issued Nov. 12, 1996. With the development of both n-type and p-type active polymer materials, as described in these patents, complementary ICs can be readily implemented, as detailed particularly in U.S. Pat. No. 5,625,199. However, following these teachings a true integrated CMOS circuit requires the preparation or deposition of two different materials to form the complementary device.

SUMMARY OF THE INVENTION

We have developed a TFT CMOS device which uses a single, homogeneous, organic semiconductor material, which in the preferred case is tetracene or pentacene. We have discovered that tetracene and pentacene, when properly prepared with the correct crystal form and purity, exhibits ambipolar behavior. Thus a single homogeneous layer of this material can be formed over two MOS gated transistors and can be operated in a complementary mode.

DETAILED DESCRIPTION

Figure 1:
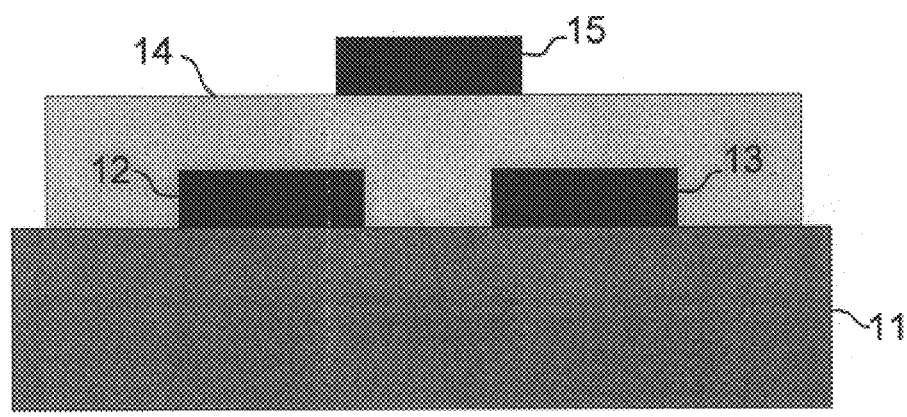
FIG. 1 is a schematic of a preferred TFT device configuration.

A basic TFT structure is shown in FIG. 1, with semiconductor substrate 11, source and drain electrodes 12 and 13, gate dielectric 14, and gate 15. According to a main feature of the invention the semiconductor substrate is an organic ambipolar material that is essentially intrinsic, but, depending on the polarity of the gate voltage, can be transformed to n-type or p-type semiconductor. In the preferred embodiment of the invention the ambipolar material is pentacene. Tetracene and pentacene are known to have very high hole mobility and consequently function efficiently for p-channel transistors operating in the accumulation mode. We have found that high quality, pure, tetracene or pentacene crystals have sufficiently low trap density for both holes and electrons that it can be operated also in the inversion mode. Thus a pair of transistors having the identical structure as shown in FIG. 1 can be integrated and operated as a CMOS pair. Measurements have shown room temperature mobilities of the order of 2 $cm^2/Vs$ for both carrier types, increasing at low temperatures up to 1200 $cm^2/Vs$ for p-type and 300 $cm^2/Vs$ for n-type. Room temperature ON-OFF ratios exceeding $10^8$ have been measured.

High purity tetracene and pentacene single crystals may be grown by physical vapor deposition (PVD) in a transport process as described for example in "Physical vapor growth of organic semiconductors", R. A. Laudise et al., Journal of Crystal Growth 187 (1998) 449–454. Crystals may be prepared in a horizontal transport tube using a transport gas of $N_2$ and $H_2$ flowing at 30 ml/min. with a 2.5 $cm^2$ tube (cross section area). A source temperature of 285° C. and a deposition temperature in the range 220° C. and 280° C. produces 10×2 mm crystals. Crystals produced by PVD were found by space charge limited current measurements to have trap concentrations (for holes) and acceptor densities as low as $10^{13}$ and $10^{11}$ $cm^{-3}$, respectively.

MOS devices were produced using pentacene crystal substrates, and gold evaporated source and drain contacts with a width of 500 to 1500 $\mu$m spaced at between 25 and 50 $\mu$m. The gate dielectric was aluminum oxide, $Al_2O_3$, deposited by r-f magnetron sputtering (capacitance $C_i$ approx. 30 $nF/cm^2$). The gate electrode was evaporated gold.

Figure 2:
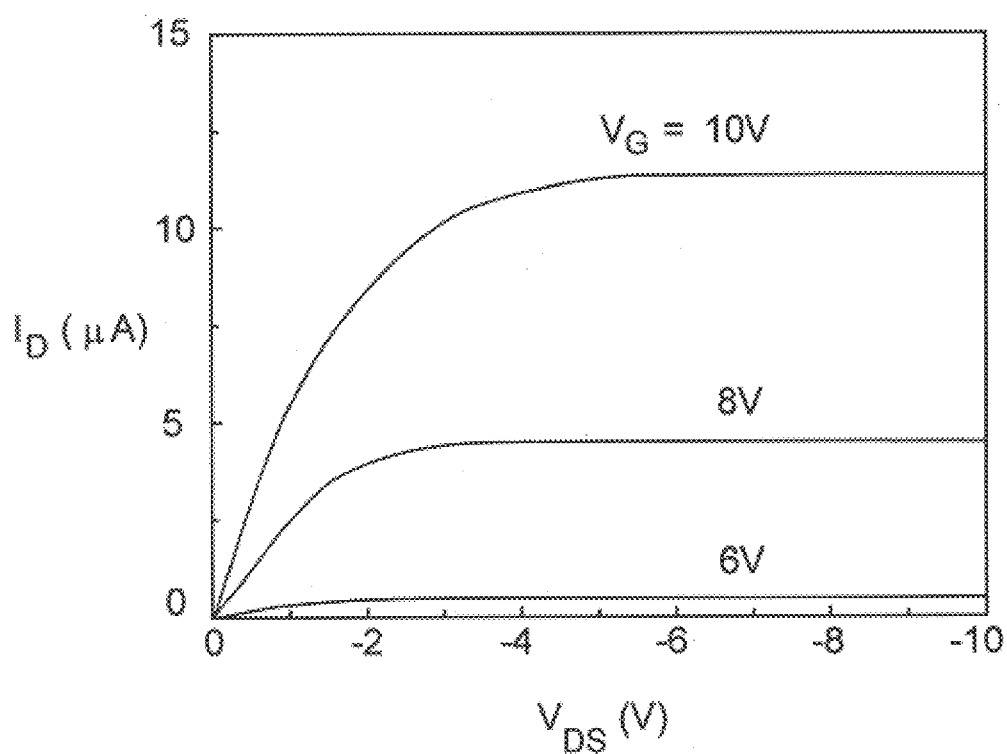
FIG. 2 is a plot of drain current vs. drain-source voltage for a pentacene TFT of the invention showing operation in the inversion mode (n-type)
Figure 3:
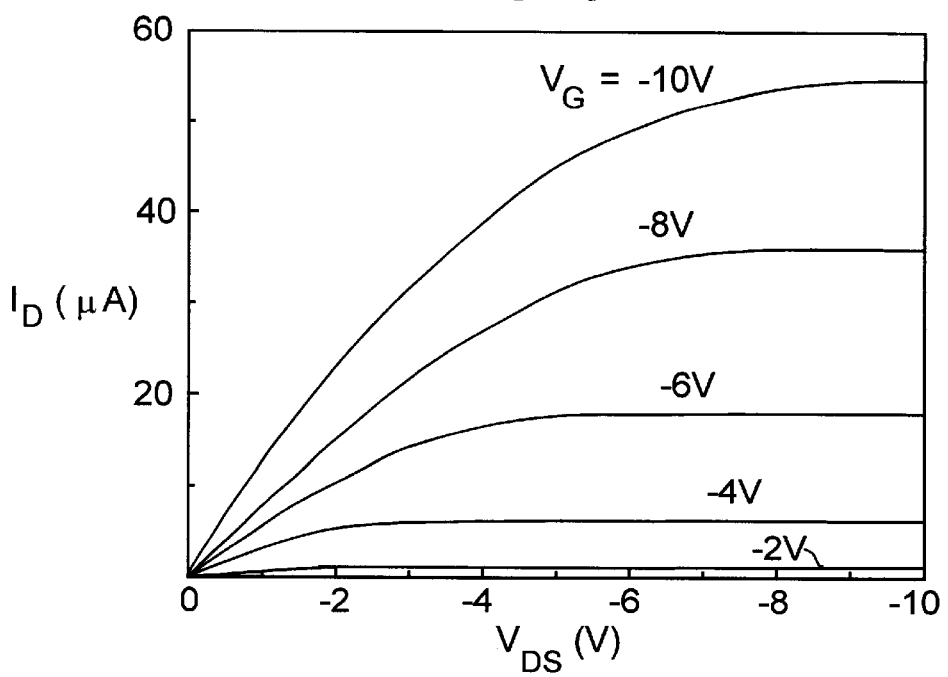
FIG. 3 is a plot of drain current vs. drain-source voltage for a pentacene TFT of the invention showing operation in the accumulation mode (p-type)

The $I_D/V_{SD}$ characteristics were measured at room temperature and are presented in FIGS. 2 and 3. The curves in FIG. 2 show characteristics for a device operating in the inversion mode, and the curves of FIG. 3 show the characteristics for a device operating in the accumulation mode.

For operation in inversion, an electron mobility of 1.7 cm$^2$/Vs and an ON-OFF ratio of 10$^8$ were measured. For operation in accumulation, the hole mobility measured was 2.7 cm$^2$/Vs and the ON-OFF ratio at 10 V is 10$^9$. In the accumulation mode, typical threshold voltages are approximately –1 volt. In combination with the steep sub-threshold slope of 200 meV/decade (see FIG. 4) this low threshold voltage indicates the high quality of the pentacene single crystal as well as the low surface state density of the pentacene/Al$_2$O$_3$ interface. Threshold voltages for inversion in these devices is typically somewhat higher, e.g. 5 V, which reveals the higher trap density for electrons than for holes.

Extraordinarily simple CMOS devices can be produced using tetracene or pentacene. A single homogeneous semiconductor layer may be used for both devices, eliminating the need, as in conventional devices, for separate n-type and p-type materials, or N and P wells, in the substrate. Due to the device structure, as will become evident, isolation is simplified.

Figure 4:
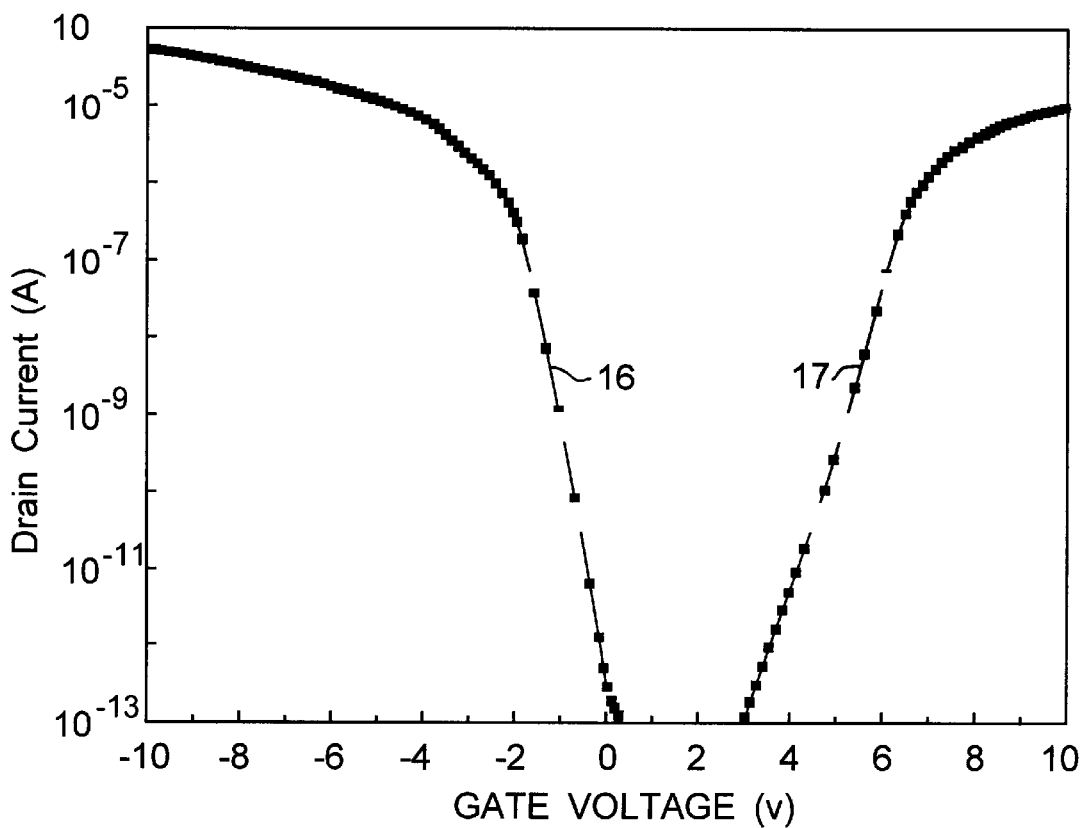
FIG. 4 is a plot of drain current versus gate voltage for a pentacene TFT of the invention.
Figure 6:
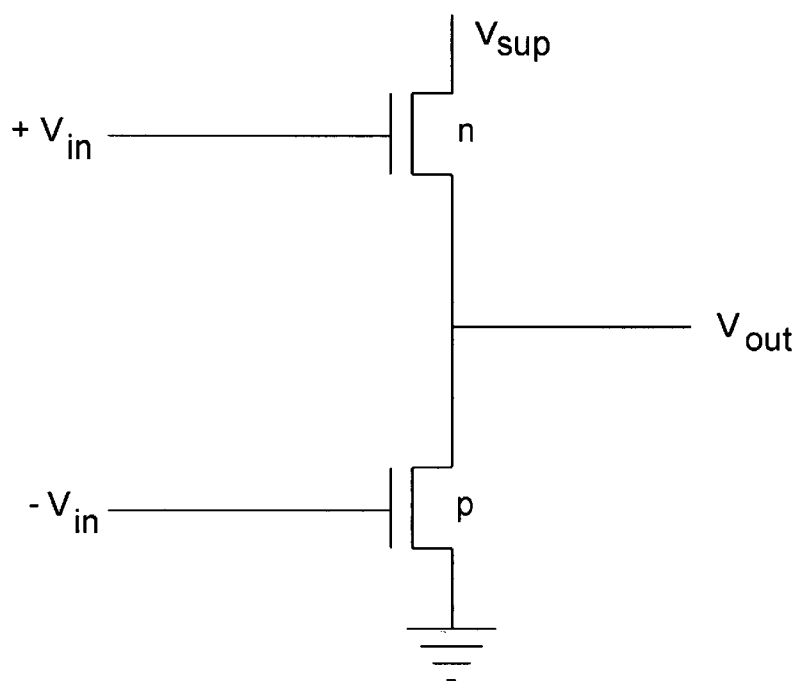
FIG. 6 is a schematic diagram of a CMOS inverter using pentacene TFTs according to the invention.

The transfer characteristic for a single TFT pentacene transistor as just described in shown in FIG. 4. Curve 16 gives data for the device in accumulation (p-channel) operation, i.e. negative gate voltage and negative source drain voltage, and curve 17 gives data for the device operating in inversion, i.e. positive gate voltage, positive source. Two such field effect transistor (FET) devices can be combined to form an inverter circuit (FIG. 6). This can be realized either by connecting two FETs each with a source and drain contact (4 electrodes) or by using one common electrode (3 electrodes). Using the former method, a gain as high as 10 has been measured. Higher gains, as high as 23, have been measured on devices using different metals as source/drain electrodes in the n- and p-type device sections. Due to the high mobilities observed in these devices, especially for n-type transport, a significant improvement in switching speed and performance over previously described organic complementary circuits can be realized. This performance advantage is over and above the simplified processing and attendant lower cost of ambipolar CMOS devices.

Figure 5:
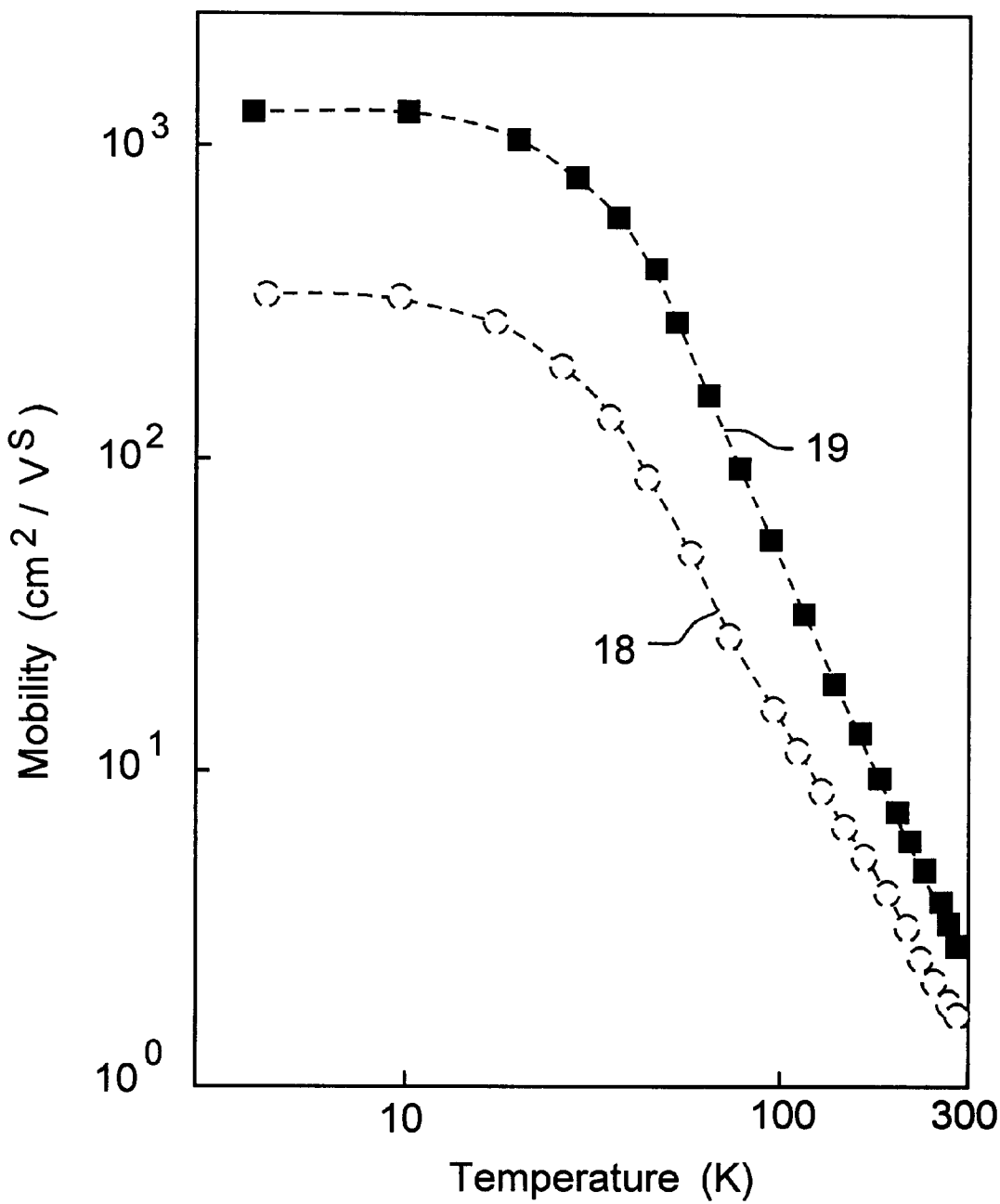
FIG. 5 is a plot of temperature vs. mobility showing the power law dependence with temperature for both n-type and p-type pentacene TFT devices.

The temperature dependence of the field-effect mobility in a TFT transistor was measured and is presented in FIG. 5. Curve 18 shows data for a device operating in n-type mode, and curve 19 shows data for a device in p-type mode. As mentioned earlier, the mobilities increase following a power law from 2.7 or 1.7 at room temperature up to 1200 or 300 cm$^2$/Vs at low temperatures. This temperature dependence and the very high low temperature mobilities suggest that charge transport in these devices is governed by band-like motion similar to that seen in conventional inorganic semiconductors, and further suggests that other aspects of device operation and performance will track known models.

A processing sequence for making ambipolar TFT CMOS devices is described as follows in conjunction with FIGS. 7–24. The device used for illustration is a simple inverter circuit as shown in FIG. 6. The TFT device structure used for the process illustration is the upside-down configuration that is described and claimed in U.S. patent application Ser. No. 09/137,920 filed Aug. 20, 1998, which is incorporated herein by reference. This TFT structure offers several advantages. It can be made with simple processing. The deposition of the semiconductor layer occurs late in the process thus avoiding hostile process conditions such as etchants, cleaning agents, high temperature, etc. Importantly, the upside down structure, as described here, has inherent electrical isolation between devices in a CMOS pair as well as between pairs.

Figure 7:
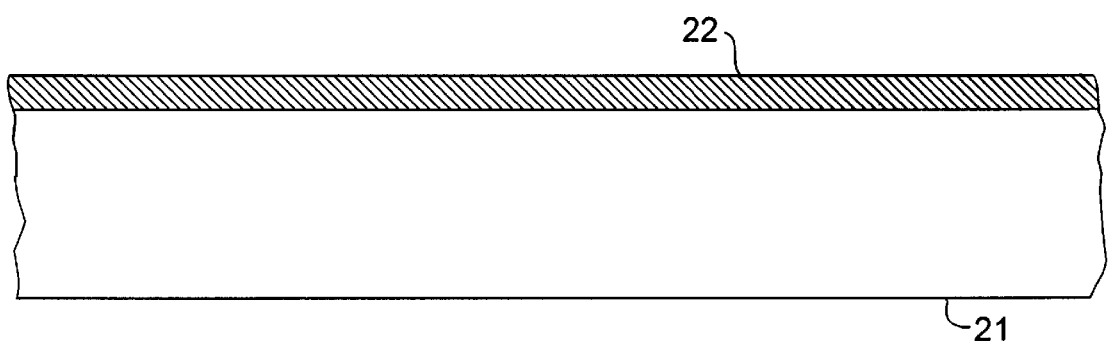
FIGS. 7–24 are schematic representations of process steps useful for forming the CMOS inverter of FIG. 6, or similar IC devices.

Referring to FIG. 7, a portion of an IC substrate is shown at 21. A single TFT CMOS pair will be illustrated for simplicity, but it will be understood that the single pair of devices is representative of a large integrated array of devices. Also, the features shown in the figures herein are not to scale. Substrate 21 is an insulating material such as ceramic, glass, a polymer, or may be a metal foil covered with an insulating layer. It may be rigid or flexible, and it may comprise a standard printed circuit substrate of expoxy or ceramic. Alternatively it may be silicon on which an insulating layer of SiO$_2$ is grown or deposited. The first level metal is shown at 22. In this inverted structure this level is referred to as the first level because it is formed first but, as will be appreciated by those skilled in the art, it corresponds to the second or third level metal in traditional structures. The metal may be any of a variety of conductive materials. The common choice in standard IC technology is aluminum. However, due to the nature of the structures described here the choice of conductive material may be made from a larger universe than is usually considered, including the standard materials, i.e. aluminum, TiPdAu, TiPtAu, TaN, TiN, Au, Ni, etc., as well as non-traditional choices most notably, copper, and conductive polymers such as polyanaline and metal-containing polymer inks. The use of polymer conductors may be favored in applications where a degree of flexibility is desired. The choice of deposition technique is wide since the structures at this stage in the processing, as contrasted with traditional IC processing at this stage, have no thermally sensitive components. Thus this deposition step, as well as subsequent deposition and etching steps used for forming the two level or multi-level metallization interconnections, may involve significant substrate heating if that is otherwise convenient and cost effective. Accordingly, the metal layer can be evaporated, or sputtered. The thickness of the metal layer can vary widely, but will typically be in the range 0.05 to 2 μm.

Figure 8:
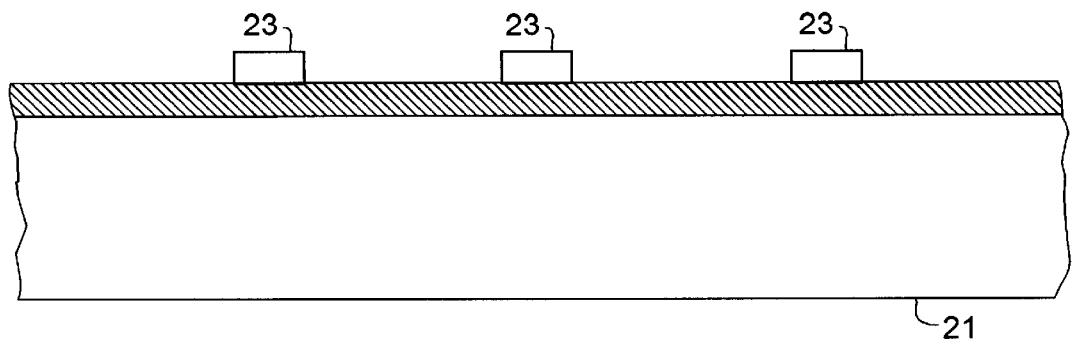
Figure 9:
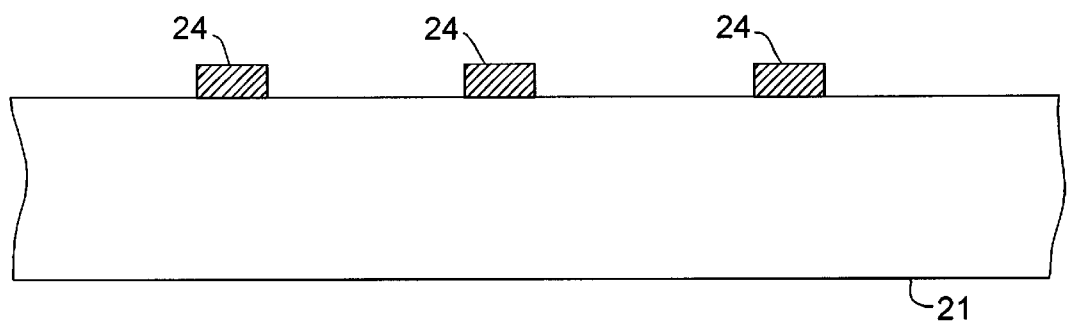

The next step, represented by FIG. 8, is to pattern the first level metallization using a lithographic mask 23. The mask is typically made by photolithography, but may also be formed using e-beam or x-ray lithography. Other masking steps, to be described below, may also utilize these alternative lithography technologies. The first metal layer is then patterned by standard etching, e.g. plasma or RIE etching, to produce the pattern of metal runners 24 as shown in FIG. 9. Patterning of these metal layers may also be achieved by additive techniques such as screen printing, stamping, microprinting, etc., which may be expected to provide cost advantages.

With a wide choice of conductive materials available, it may be useful, in applications where the interconnect density is not large, to print the circuit directly, using screen printing, stenciling, ink jet printing or a similar technique.

Figure 10:
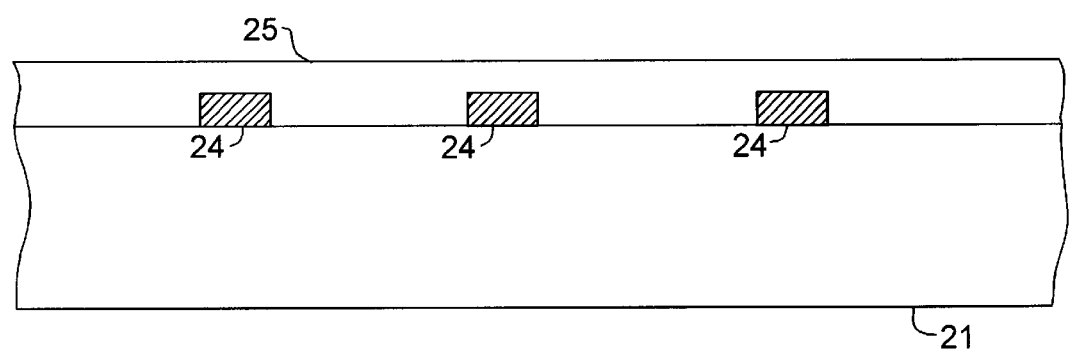

With reference to FIG. 10, the first interlevel dielectric 25 is formed over the first level metal pattern as shown. The interlevel dielectrics in the structures according to the invention may be of a variety of insulating materials such as spin on glass (SOG), or Si$_3$N$_4$ or SiO$_2$ deposited by CVD for example. In the TFT structures described here, it is expected that the use of polymer materials wherever they can be effective will be desirable, both from the standpoint of processing simplicity and cost, and also to produce IC structures that tolerate strain, i.e. are somewhat flexible. Accordingly, for such applications the use of polyimide or similar organic polymer insulating material insulators may be desirable. A suitable material is a polyimide supplied by Nissan Chemical Company under the designation RN-812. This material can easily be produced in layers with 0.1–1 μm thickness, which have desirable insulating properties. The application technique for organic insulators is typically spin coating or solution casting. Some inorganic insulators, notably spin-on-glass, also share the property of convenient application. In some applications, where fine pattern dimensions are not required, the dielectric layer may be applied as a patterned layer, already containing the interlevel windows.

Figure 11:
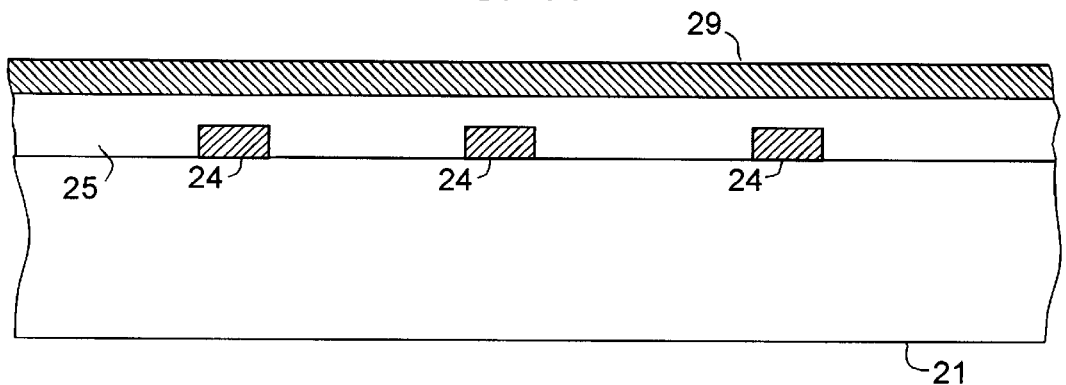
Figure 12:
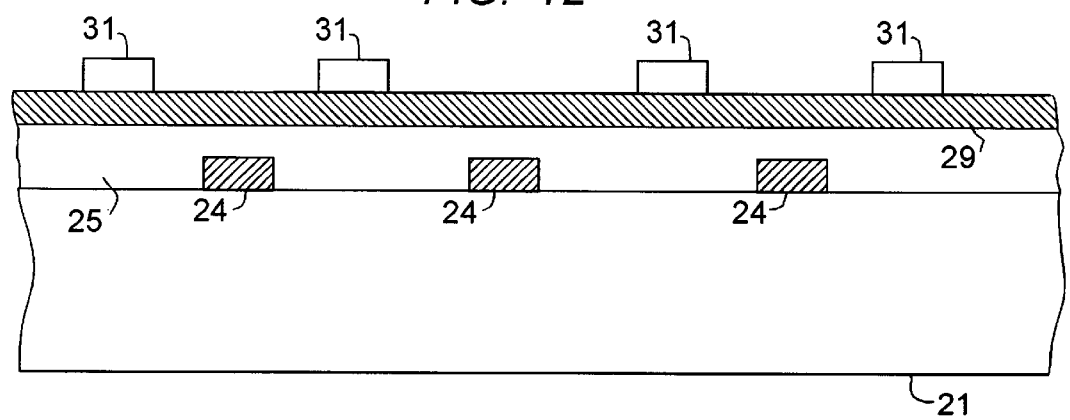
Figure 13:
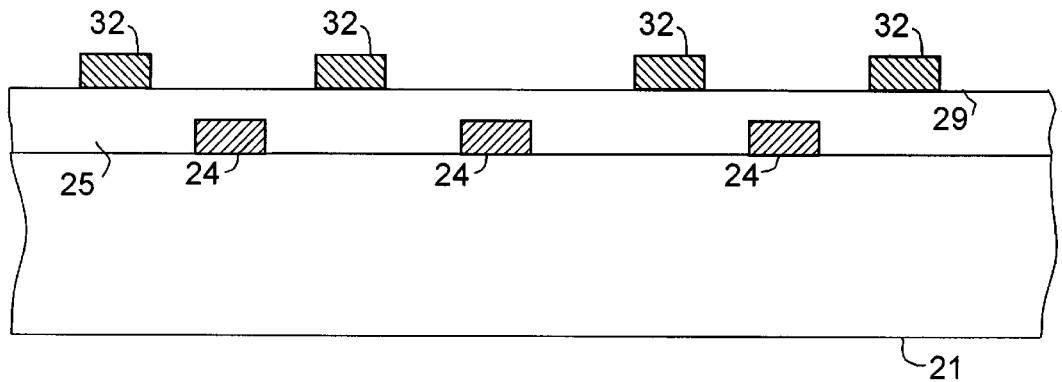

The second level metal, 29, is deposited over the first interlevel dielectric 25 as shown in FIG. 11. The second level metal may be the same as, or may be different from, the first level metal. The second level metal is patterned in a manner similar to the first level using mask 31 to form runners 32 as shown in FIGS. 12 and 13.

Figure 14:
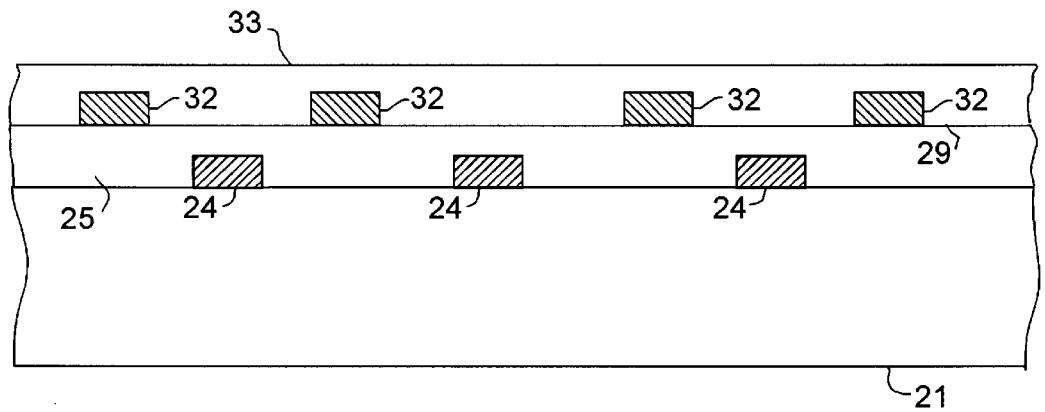
Figure 15:
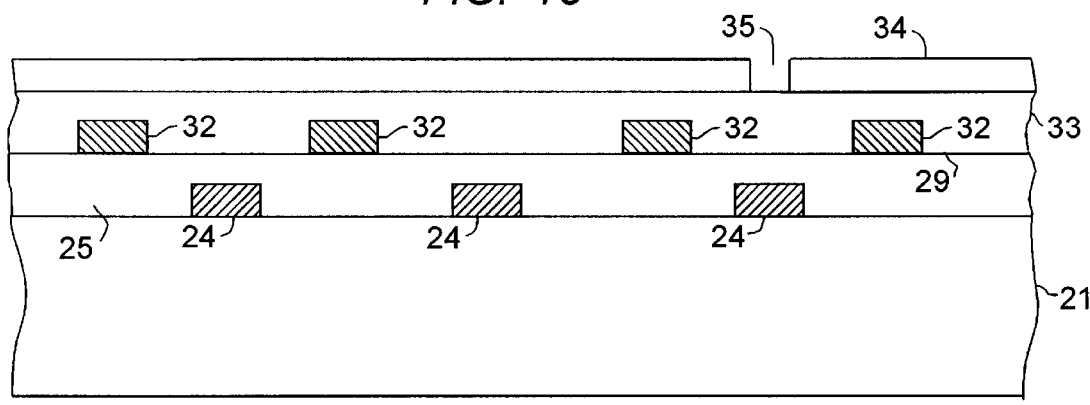
Figure 16:
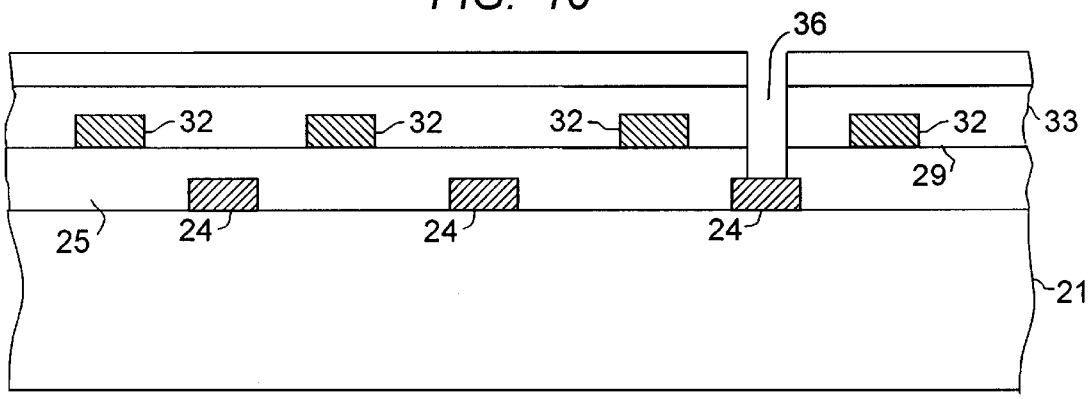

The next step forms the second interlevel dielectric 33 as shown in FIG. 14. This layer may be formed in a manner similar to layer 25. Interlevel dielectric 33 is provided with through holes or windows for interlevel interconnections between the first level (24) and the gate level to be formed next. The interlevel dielectric is masked with patterned mask 34 as shown in FIG. 15, and the portion of dielectric layer 33 exposed by the opening 35 in the resist is etched to form a window to interconnect the first and gate levels. The mask opening is aligned to metal runner 24 in the first level interconnection pattern. A single interlevel interconnection is shown for simplicity, but a typical IC will have many such interlevel interconnections. These interlevel interconnections are standard, and techniques for forming the interlevel windows are well known. For example, if the dielectric layer is $SiO_2$ the windows may be formed by plasma etching or RIE. The resulting structure is shown in FIG. 16, with interlevel window 36 formed in the dielectric layers 25 and 33.

The gate level metal, usually the first level metal in a traditional structure, and usually of polysilicon, is formed late in the sequence of the invention, and may comprise a wide variety of metals. The usual requirement that the gate level metal be relatively refractory to withstand the conventional implantation drive steps is eliminated in the process of the invention, so the gate material may be selected from many materials, even aluminum or copper. However, the art has extensive experience with silicon gates insulated with grown $SiO_2$. Tantalum gates insulated with TaN or TiN may also be convenient. Conducting polymers may also be suitable for the gate metal and are especially compatible with other elements in the structures described here.

Figure 17:
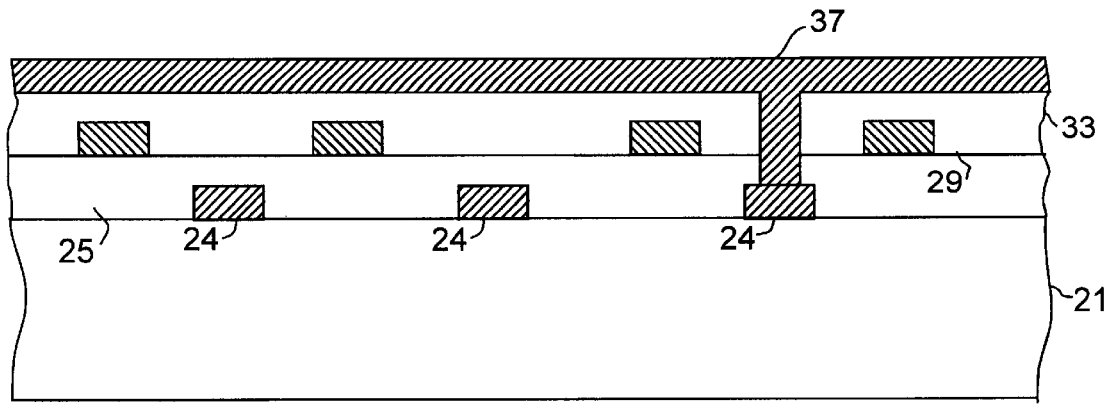
Figure 18:
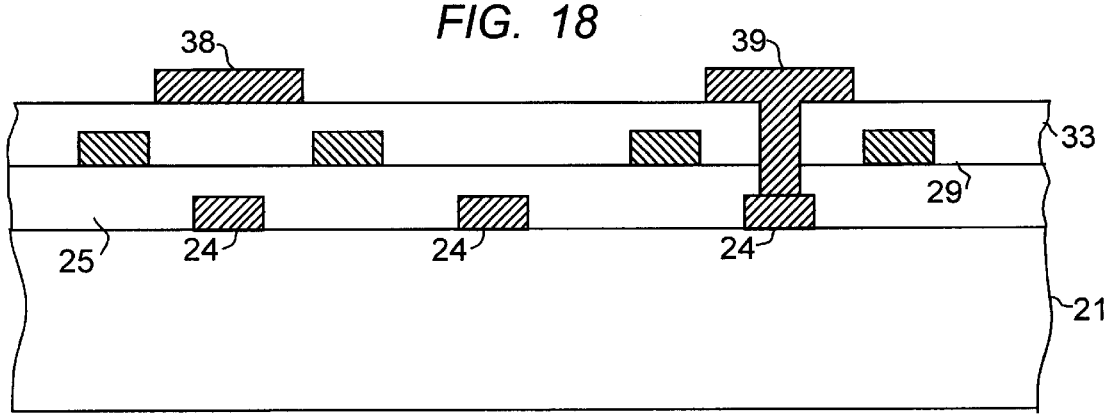

The gate metal layer 37 is shown in FIG. 17 deposited over the second interlevel dielectric layer 33 and into the windows that will interconnect selected gates to the first level metal. The gate metal layer is then patterned (FIG. 18) by lithography to form gate structures 38 and 39. Gate 38 is interconnected on the gate level and gate 39 is interconnected, in this illustrative arrangement, to runner 24 on the first level. This allows different voltages to be applied to the gates of a CMOS pair. For simplicity, the metal is shown deposited into the window as a part of the gate metal deposition step. As known by those skilled in the art, interlevel plug technologies can be used for forming the interlevel interconnections.

Figure 19:
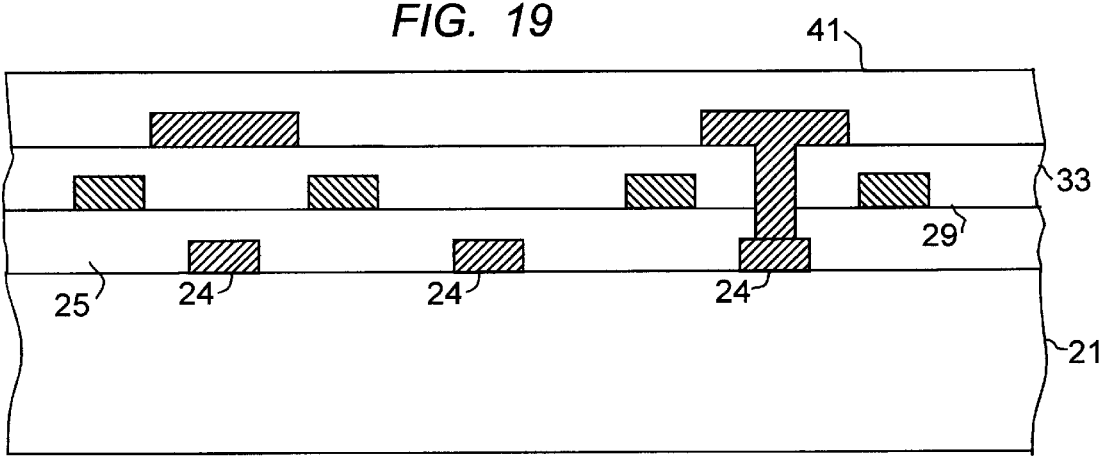

The gate dielectric 41 is then formed over the structure as shown in FIG. 19. The gate dielectric may be of a conventional oxide or nitride as indicated above, or may be SOG or an organic insulator such as polyimide that can be formed conveniently by spin-on techniques. An example of such a material is pre-imidized polyimide, supplied by Nissan Chemical Company under the designation SE-1180. This material can be spun on at 4000 RPM and cured at 120° C. for 2 hours to produce a coating with a thickness of 70 nm. If desired, the gate material may be polysilicon, and the gate dielectric grown as a surface layer over the polysilicon in which case the gate dielectric layer 41 would not cover the entire second interlevel dielectric as it appears in FIG. 19.

Figure 20:
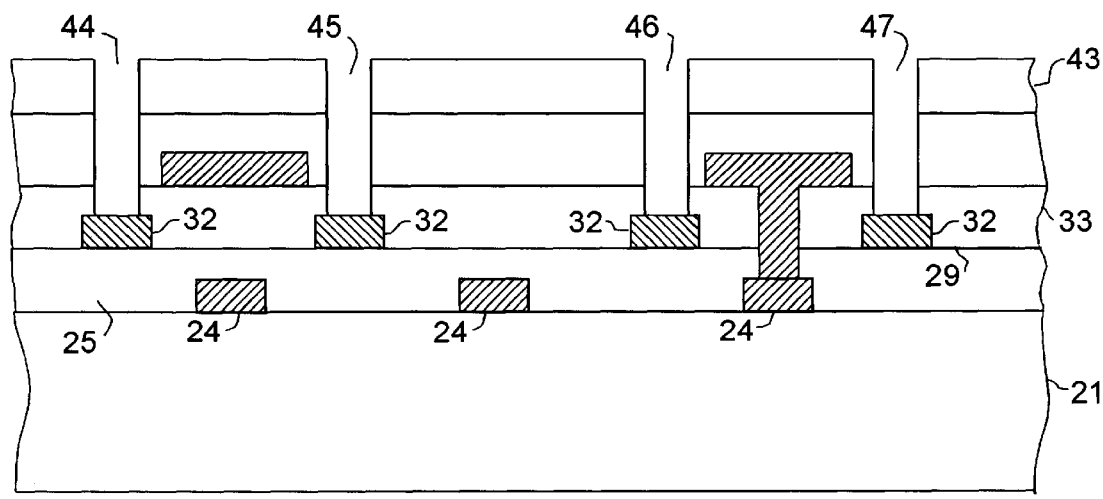

The gate dielectric is masked with patterned mask 43 as shown in FIG. 20, and the portion of gate dielectric layer 41 and the underlying portion of dielectric layer 33 exposed by the openings 44, 45, 46, and 47 in the resist, is etched to form a window to interconnect the source drain contacts to the second metal level. The mask openings are aligned to metal runners 32 in the second level interconnection pattern.

Figure 21:
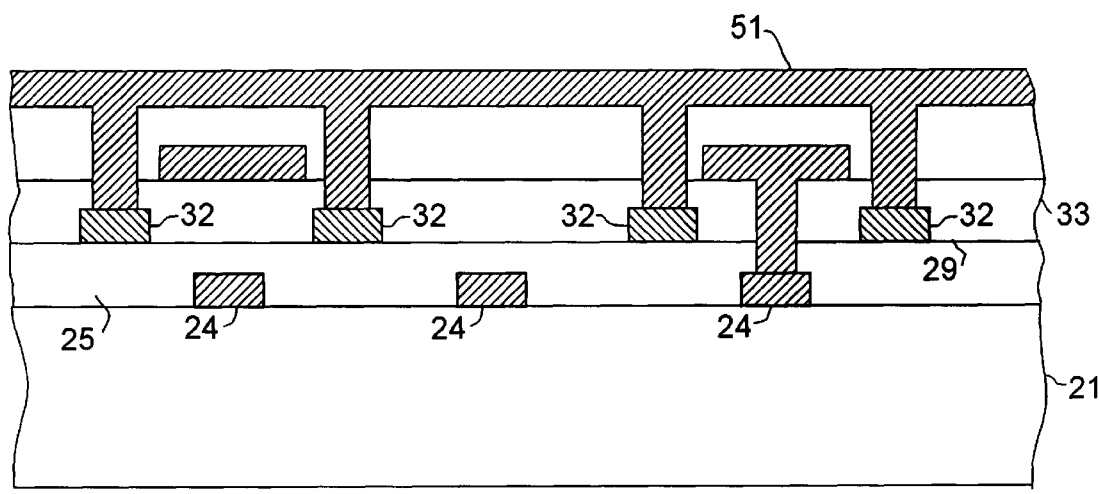
Figure 22:
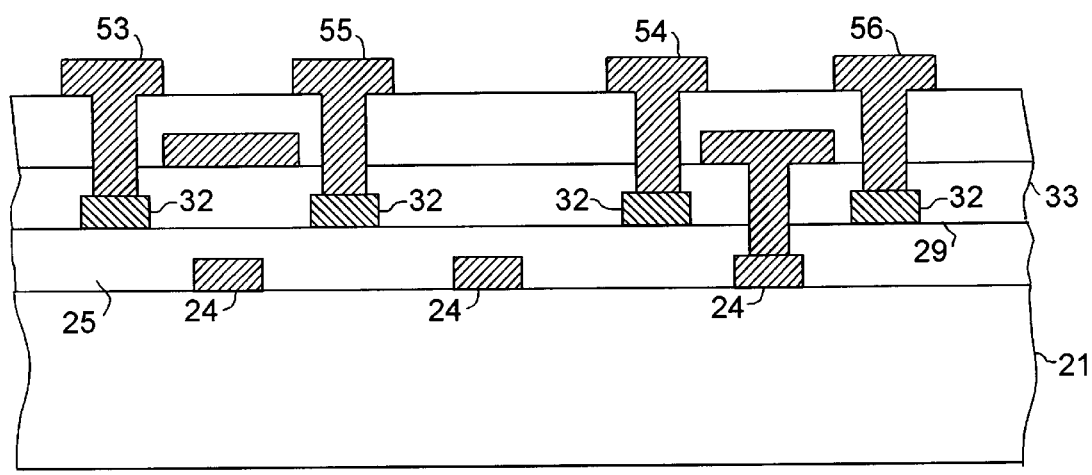

The source/drain contact layer 51 is then deposited over the structure as shown in FIG. 21, and metal contact is made to the second level runners 32. Layer 51 is then patterned using a lithographic mask (not shown) to define source electrodes 53, 54 and drain electrodes 55, 56, as shown in FIG. 22. Alternatively, the source and drain can be formed using known additive technology. The source and drain electrode materials may be gold, aluminum, polysilicon or any of a number of metal conductors, or may be organic conductors such as polyaniline. For display applications the electrodes may be indium tin oxide. As is well known, the position of the source and drain electrodes should be adjacent to the gate electrode in the vertical plane, or should overlap slightly the edge of the gate electrode.

Figure 23:
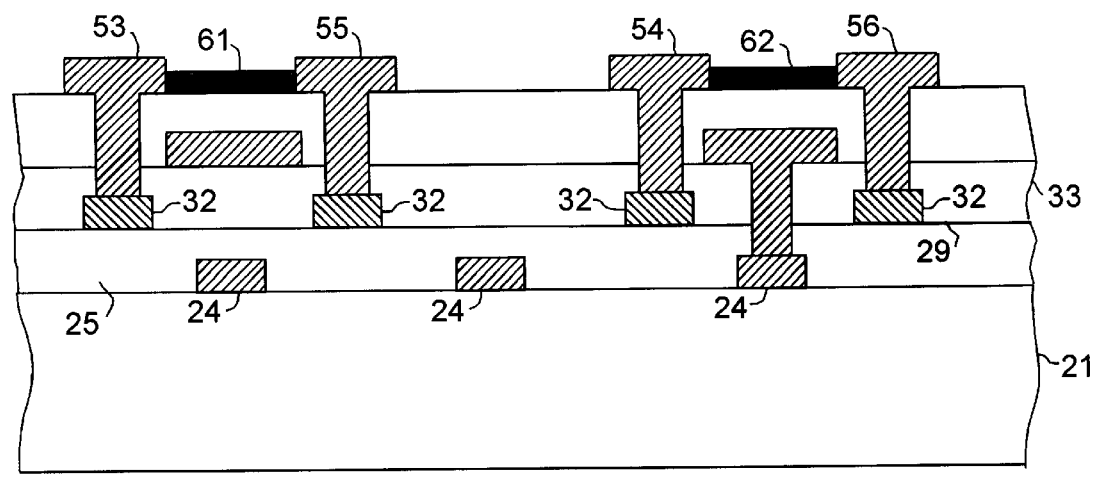

One of the last essential steps in the process of the invention, which is the first step in the traditional FET process, is illustrated in FIG. 23 and is the formation of the active semiconductor bodies 61, 62 in which the field effect is realized, and in which the FET channel extends between sources 53, 54 and drains 55, 56. In this invention, the active material is an organic ambipolar semiconductor.

Figure 24:
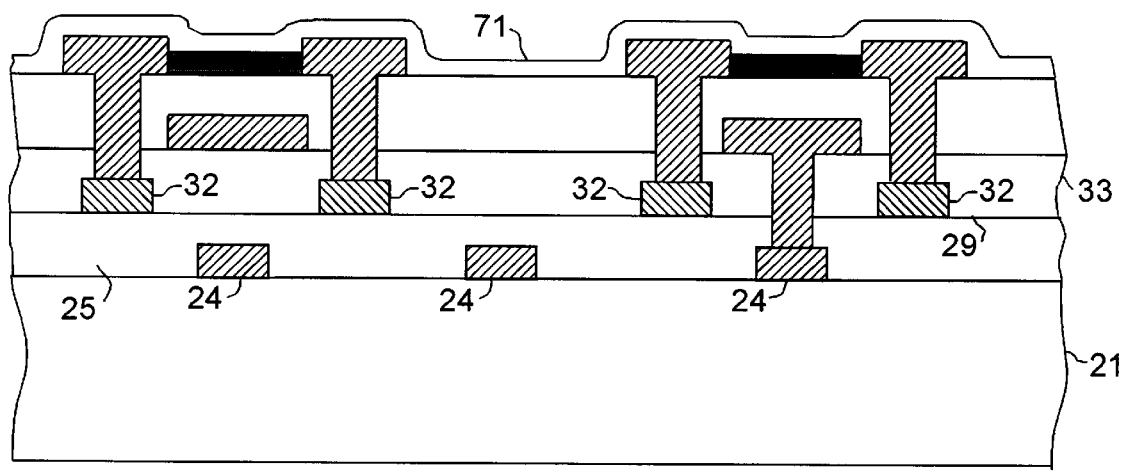

If necessary, the device can be sealed using a conventional passivating layer 71 as shown in FIG. 24. The passivating layer may be polyimide.

Figure 25:
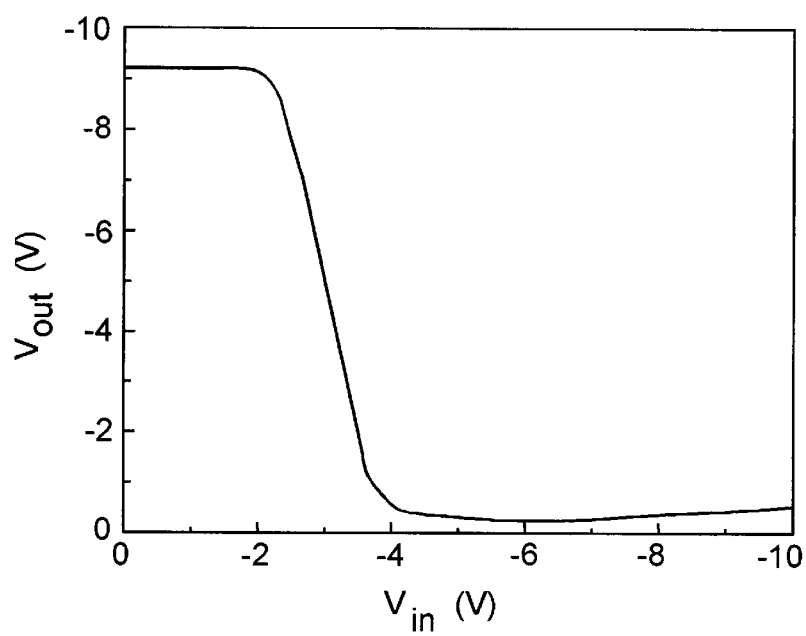
FIG. 25 is a transfer characteristic for the inverter circuit of FIG. 6.

FIG. 25 shows a transfer characteristic for the CMOS device represented by FIG. 6. A gain of 10 was measured.

As mentioned earlier, the TFT structure described and produced by the foregoing sequence of steps is but one form of TFT to which the invention can be applied.

As indicated earlier, the features in the figures are not necessarily to scale. The dimensions of the active devices, i.e. the TFTs, can be made very small using fine line techniques. At very small dimensions a single polymer chain, or a few organic molecules span the source-to-drain distance. With such an IC technology, it is possible to achieve extremely high integration densities. The molecular nature of organic/polymer semiconductors allows the size of such transistors to shrink to such small dimensions, and also enables effective isolation between individual transistors. The dimensions of some of the interconnections, e.g. power and ground interconnections, may be significantly larger than those that appear in the figures.

It will be understood by those skilled in the art that an important feature of the invention is that a single ambipolar material, with a homogeneous composition throughout, may form the semiconductor element of both transistors of a CMOS pair. The advantages of this feature from the standpoint of process simplicity and cost are evident.

The process sequence shown above for making the CMOS inverter circuit has three metal levels, partly to show the potential of the process for making more complex circuits.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. An integrated circuit CMOS device comprising:
   a. a substrate, said substrate comprising an organic semiconductor material with a homogeneous composition throughout,
   b. a pair of field effect transistor devices formed on said substrate said pair of field effect devices comprising a first MOS transistor and a second MOS transistor in each of which the semiconductor of the MOS transistor is the said substrate, each of the MOS transistors comprising:
      i. a source electrode on said substrate,
      ii. a drain electrode on said substrate and spaced from said source electrode leaving a channel location therebetween,
      iii. a dielectric layer covering both said source electrode and said drain electrode, and
      iv. a gate electrode overlying said channel location,
   c. means for biasing the gate electrode of said first MOS transistor with a positive voltage, and
   d. means for biasing the gate electrode of said second transistor with a negative voltage.

2. The integrated circuit device of claim 1 wherein the ambipolar semiconductor material is selected from the group consisting of tetracene and pentacene.

3. An integrated circuit CMOS device comprising:
   a. a substrate with the top surface thereof comprising an insulating material,
   b. a first conductive interconnection circuit on said substrate,
   c. an insulating layer covering said first interconnection circuit,
   d. at least one pair of field effect transistors formed on said insulating layer, said at least one pair of field effect transistors comprising a first field effect transistor and a second field effect transistor, each of said field effect transistors comprising:
      i. a gate electrode formed on said insulating layer, said gate electrode comprising two opposing edges,
      ii. a gate dielectric layer overlying said gate electrode, and forming a channel region over said gate electrode extending between said two opposing edges,
      iii. a source electrode adjacent said gate electrode on one of said two opposing edges, thereby forming a first edge of said channel region,
      iv. a drain electrode adjacent said gate electrode on the other of said two opposing edges, thereby forming a second edge of said channel region,
      vi. a semiconductor layer in said channel region,
   e. means for biasing the gate electrode of said first MOS transistor with a positive voltage,
   f. means for biasing the gate electrode of said second MOS transistor with a negative voltage,
the invention characterized in that the material of the semiconductor layer for the first MOS transistor and the material of the semiconductor layer of the second MOS transistor are essentially identical in composition.

4. The integrated circuit CMOS device of claim 3 wherein said semiconductor material is selected from the group consisting of tetracene and pentacene.

5. The integrated circuit CMOS device of claim 3 further including a second conductive circuit and an insulating layer covering said second conductive circuit.

6. The integrated circuit CMOS device of claim 5 wherein the said conductive circuits comprise an organic polymer.

7. A method for manufacturing an integrated circuit CMOS device comprising:
   a. preparing a substrate, said substrate comprising an organic semiconductor material with a homogeneous composition throughout,
   b. forming a pair of field effect transistor devices on said substrate said pair of field effect devices comprising a first MOS transistor and a second MOS transistor with the substrate comprising the semiconductor of both of the MOS transistors, each of said MOS transistors made by the steps comprising:
      i. depositing a source electrode on said substrate,
      ii. depositing a drain electrode on said substrate and spaced from said source electrode leaving a channel location therebetween,
      iii. depositing a dielectric layer covering both said source electrode and said drain electrode, and
      iv. forming a gate electrode overlying said channel location,
   c. means for biasing the gate electrode of said first MOS transistor with a positive voltage, and
   d. means for biasing the gate electrode of said second transistor with a negative voltage.

8. The method of claim 7 wherein the ambipolar semiconductor material is selected from the group consisting of tetracene and pentacene.

9. A method for the manufacture of an integrated circuit comprising the steps of:
   a. depositing a first electrically conductive layer on an insulating substrate,
   b. patterning said first electrically conductive layer to form an interconnect circuit,
   c. depositing a first insulating layer over said first interconnect circuit,
   d. depositing a second electrically conductive layer on said first insulating layer,
   e. patterning said second electrically conductive layer to form a second interconnect circuit,
   f. depositing a second insulating layer over said second interconnect circuit,
   g. forming at least one pair of field effect transistors comprising a first field effect transistor and a second field effect transistor, each of said field effect transistors made by the steps of:
      i. forming a field effect transistor gate,
      ii. forming a gate dielectric layer over said field effect transistor gate,
      iii. forming spaced apart source and drain electrodes, and
      iv. forming an active layer between said source and drain electrodes, said active layer comprising a semiconductor layer,
   h. interconnecting the gate of said first field effect transistor to said first interconnect circuit and interconnecting the gate of said second field effect transistor to said second interconnect circuit, and
   i. providing means for biasing the gate electrode of said first MOS transistor with a positive voltage,
   j. providing means for biasing the gate electrode of said second MOS transistor with a negative voltage,
the invention characterized in that the material of the semiconductor layer for the first MOS transistor and the material of the semiconductor layer of the second MOS transistor are essentially identical in composition.

10. The method of claim 9 wherein the semiconductor material is selected from the group consisting of tetracene and pentacene.

* * * * *